United States Patent
Park et al.

(10) Patent No.: US 8,089,820 B2
(45) Date of Patent: Jan. 3, 2012

(54) SEMICONDUCTOR INTEGRATED CIRCUIT AND METHOD THEREOF

(75) Inventors: Ki-Chon Park, Ichon (KR); Jae-Hoon Cha, Ichon (KR)

(73) Assignee: Hynix Semiconductor Inc. (KR)

(*) Notice: Subject to any disclaimer, the term of this patent is extended or adjusted under 35 U.S.C. 154(b) by 184 days.

(21) Appl. No.: 12/346,225

(22) Filed: Dec. 30, 2008

(65) Prior Publication Data
US 2010/0067315 A1      Mar. 18, 2010

(30) Foreign Application Priority Data

Sep. 17, 2008    (KR) .................. 10-2008-0091027

(51) Int. Cl.
*G11C 7/00* (2006.01)
(52) U.S. Cl. ............... 365/193; 365/230.03; 365/230.06
(58) Field of Classification Search .................. 365/193, 365/230.06, 230.03
See application file for complete search history.

(56) References Cited

U.S. PATENT DOCUMENTS

| | | | |
|---|---|---|---|
| 5,691,949 A * | 11/1997 | Hively et al. ............ | 365/230.03 |
| 5,703,813 A | 12/1997 | Manning et al. | |
| 5,825,710 A * | 10/1998 | Jeng et al. ................ | 365/230.03 |
| 6,005,823 A | 12/1999 | Martin et al. | |
| 6,570,800 B2 | 5/2003 | Tanaka et al. | |
| 2007/0250677 A1* | 10/2007 | Ware et al. .................... | 711/167 |

FOREIGN PATENT DOCUMENTS

| | | |
|---|---|---|
| KR | 100313087 | 10/2001 |
| KR | 100343149 | 6/2002 |
| KR | 100368970 | 1/2003 |
| KR | 100728563 | 6/2007 |

* cited by examiner

*Primary Examiner* — Pho M Luu
(74) *Attorney, Agent, or Firm* — Baker & McKenzie LLP

(57) ABSTRACT

A semiconductor IC device which includes a common column signal generating block and a column strobe signal generating block. The common signal generating block can provide precolumn strobe signals by using external command signals and a first group of bank addresses among a plurality of bank addresses. The column strobe signal generating block can provide a plurality of column strobe signals to selectively activate a plurality of banks by using the precolumn strobe signals and a second group of bank addresses among the plurality of bank addresses that are not used when the precolumn strobe signals are generated.

16 Claims, 6 Drawing Sheets

SEMICONDUCTOR INTEGRATED CIRCUIT AND METHOD THEREOF

CROSS-REFERENCES TO RELATED APPLICATION

The present application claims priority under 35 U.S.C. § 119(a) to Korean application number 10-2008-0091027, filed on Sep. 17, 2008, in the Korean Intellectual Property Office, which is incorporated herein by reference in its entirety as if set forth in full.

BACKGROUND

1. Technical Field

The embodiments described herein relate to a semiconductor integrated circuit (IC) and more particularly, to a semiconductor IC that generates a column strobe signal.

2. Related Art

In general, when a column series command is input to a semiconductor IC, i.e., an external command is a read or write command, a column strobe signal is generated for each bank in response to the read or write command. Specifically, when a read or write command is input, for each bank block, a column strobe signal for each bank that activates a corresponding bank is generated for each bank block. Accordingly, each circuit unit is needed to generate the column strobe signal for each bank. Thus, a circuit unit that provides a column series command signal and a circuit unit that provides bank information may be needed.

Recently, due to high integration and a high-speed operation of semiconductor ICs, the number of banks have increased, whereby the number of column strobe signals that control individual banks have also increased. Accordingly, the size of a column strobe signal circuit unit has increased.

In general, the column strobe signal circuit unit is disposed in a peripheral circuit unit. Accordingly, columns strobe signals are transmitted through global lines that function as common signal lines between the peripheral circuit unit and the banks. Thus, the number of column strobe signals increases when the number of banks increases, which results in lowering area efficiency of the semiconductor IC.

In a column strobe signal generating block for each bank, bank address information is needed to activate any one of the banks, and a column command signal that is activated in response to a column series command is needed. Accordingly, the peripheral circuit unit generates bank decoding addresses and a column command signal and transmits the bank decoding addresses and the column command signal to each of the blocks, thereby generating the column strobe signal for each bank. Alternatively, the column strobe signal is commonly transmitted to all banks using the decoded bank address and the column series command signal. Here, if the number of banks increases, the number of bank addresses increases, which results in increasing the number of bank decoding address signals, which are needed to be commonly provided to all of the quarter blocks, or the number of column strobe signals corresponding to the number of banks. Accordingly, since the above-described signals need to be provided from the peripheral circuit unit B to the core circuit unit A, the signals are provided as global line signals, which require long loading time. Moreover, since the number of column strobe signal lines that are disposed in the peripheral circuit unit increases when the number of banks increases, area efficiency of the peripheral circuit unit is lowered.

SUMMARY

A semiconductor IC capable of providing improved area efficiency is described herein.

In one aspect, a semiconductor IC includes a common column signal generating block providing precolumn strobe signals by using external command signals and a first group of bank addresses among a plurality of bank addresses, and a column strobe signal generating block providing a plurality of column strobe signals to selectively activate a plurality of banks by using the precolumn strobe signals and a second group of bank addresses among the plurality of bank addresses that are not used when the precolumn strobe signals are generated.

In another aspect, a semiconductor IC device includes a plurality of quarter blocks, each quarter block includes a plurality of banks, a precolumn strobe signal generating block providing a plurality of precolumn strobe signals in response to a column command signal by using a first group of bank addresses capable of designating the banks to perform primary decoding, and a column strobe signal generating block generates a plurality of column strobe signals to selectively activate the banks by using the first group of bank addresses capable of designating the banks and a second group of bank addresses that are different from the first group of bank addresses to perform secondary decoding, wherein the precolumn strobe signals and the second group of bank addresses are transmitted to the quarter blocks through a plurality of global lines.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
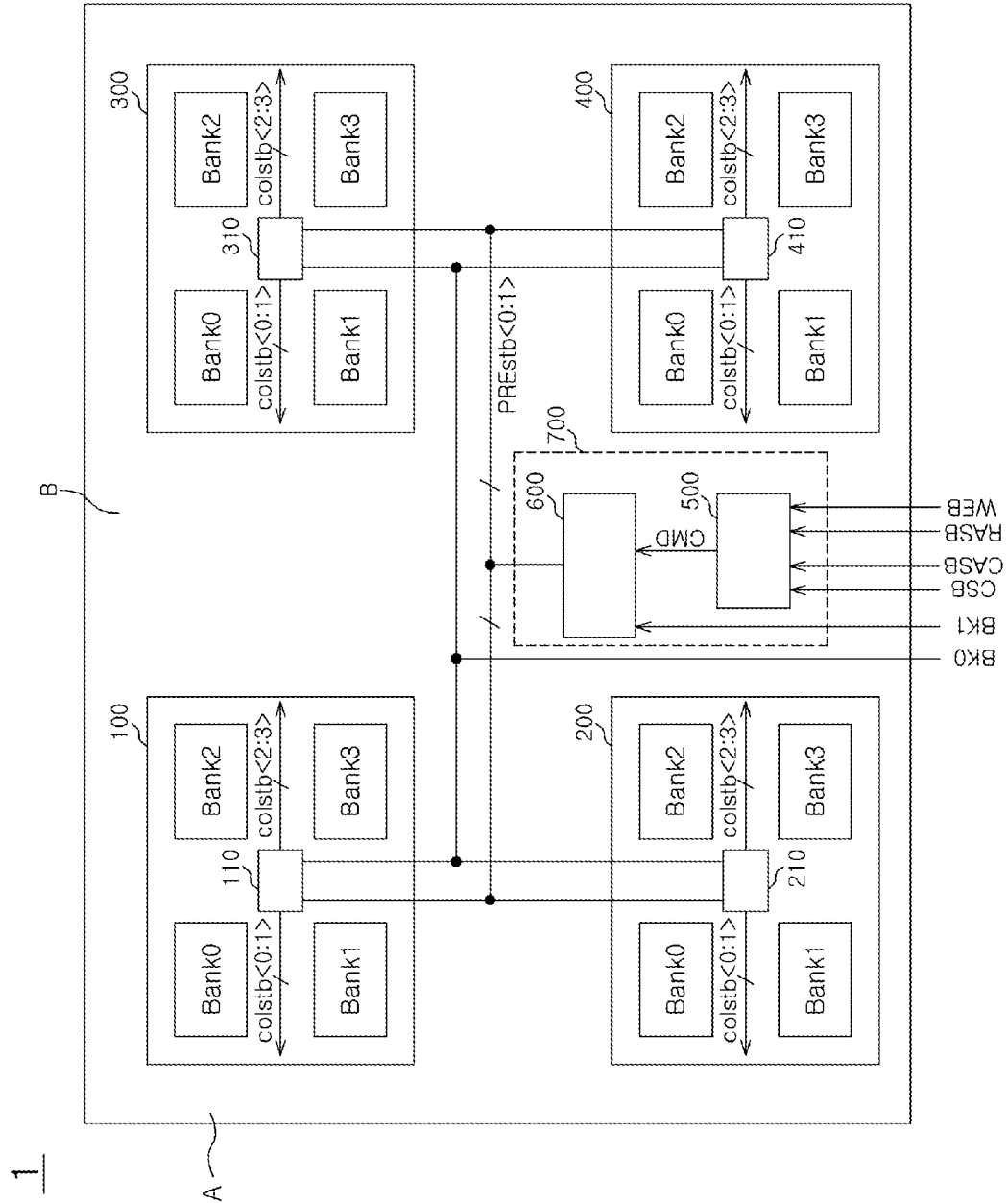
FIG. 1 is a schematic block diagram of an exemplary semiconductor IC according one embodiment.

FIG. 1 is a schematic block diagram of an exemplary semiconductor IC 1 according one embodiment. In FIG. 1, the semiconductor IC 1 can be configured to include a core circuit unit A and a peripheral circuit unit B.

The core circuit unit A can include a memory area having a memory cell array. For example, the core circuit unit A can include four quarter blocks 100, 200, 300, and 400. Each of the quarter blocks 100, 200, 300, and 400 can include four banks Bank0, Bank1, Bank2, and Bank3. When each of the quarter blocks 100, 200, 300, and 400 corresponds to 8 data input/output pads (not shown), the semiconductor IC 1 can be configured in an X32 input/output mode of a four bank structure that operates as a quarter.

Specifically, the first quarter block 100 can correspond to signals 'DQ<0:7>', the second quarter block 200 can correspond to signals 'DQ<8:15>', the third quarter block 300 can correspond to signals 'DQ<16:23>', and the fourth quarter block 40 can correspond to signals 'DQ<24:31>'. Accordingly, data may be input to one bank selected from banks Bank0, Bank1, Bank2, and Bank3 of each of the quarter blocks 100, 200, 300, and 400 through 32 data input/output pads (not shown) in response to a column series command signal, for example, a write command.

In contrast, data having 32 bits may correspond to one of the banks Bank0, Bank1, Bank2, and Bank3 of each of the quarter blocks 100, 200, 300, and 400 in response to a read command, and can be output through the data input/output pads (not shown) that correspond to the quarter blocks 100, 200, 300, and 400.

In FIG. 1, column strobe signal generating blocks 110, 210, 310, and 410 for individual banks are disposed substantially at center regions of the quarter blocks 100, 200, 300, and 400, respectively. Here, the first bank column strobe signal generating block 110 can decode first and second precolumn strobe signals 'PREstb<0:1>' and a first bank address signal 'BK0', and can provide a plurality of column strobe signals 'colstb<0:3>'. Accordingly, the first and second precolumn strobe signals 'PREstb<0:1>' can be output from a common column signal generating block 700 that can be disposed within the peripheral circuit unit B. In addition, the common column signal generating block 700 can be disposed within the peripheral circuit unit B.

In FIG. 1, the common column signal generating block 700 can include a command decoder 500 and a predecoding block 600. The command decoder 500 can provide an activated column command signal 'CMD' in the case of a column series command in response to a combination of a chip select signal 'CSB', a CAS signal 'CASB', a RAS signal 'RASB', and a write signal 'WEB'. The predecoding block 600 can provide the first and second precolumn strobe signals 'PREstb<0:1>' having bank information in response to the second bank address signal 'BK1' and the column command signal 'CMD'.

In order to decrease the number of signal lines that are provided as the global lines, the predecoded precolumn strobe signals 'PREstb<0:1>' are provided using only some of the bank addresses needed when the individual banks are selected and a column command signal 'CMD'. Accordingly, it is possible to decrease the number of global signal lines that are provided to the quarter blocks 100, 200, 300, and 400.

However, it is important to appropriately adjust the bank addresses that are used when the precolumn strobe signals 'PREstb<0:1>' are generated and the number of bank addresses that are to be used in the column strobe signal generating blocks 110, 210, 310, and 410 for the individual quarter blocks. For example, between the bank addresses that are used when the precolumn strobe signals 'PREstb<0:1>' are generated and the number of bank addresses that are to be used in the column strobe signal generating blocks 110, 210, 310, and 410 for the individual quarter blocks, a trade-off relation exists. Accordingly, if the number of global lines is minimized, the size of the circuit unit of the column strobe signal generating blocks 110, 210, 310, and 410 for the individual banks can be excessively increase, which can result in lowering area efficiency of each core circuit unit A.

In FIG. 1, it is assumed that one bank address can be used as a predecoding address. For example, since four banks can be disposed for each of the quarter blocks 100, 200, 300, and to 400, two bank addresses 'BK0' and 'BK1' are needed. Here, only one of the two bank address signals is used when the precolumn strobe signals 'PREstb<0:1>' are used. Accordingly, if any one of the first and second bank addresses 'BK0' and 'BK1' is used, it is possible to increase area efficiency of the peripheral circuit unit.

Figure 2:
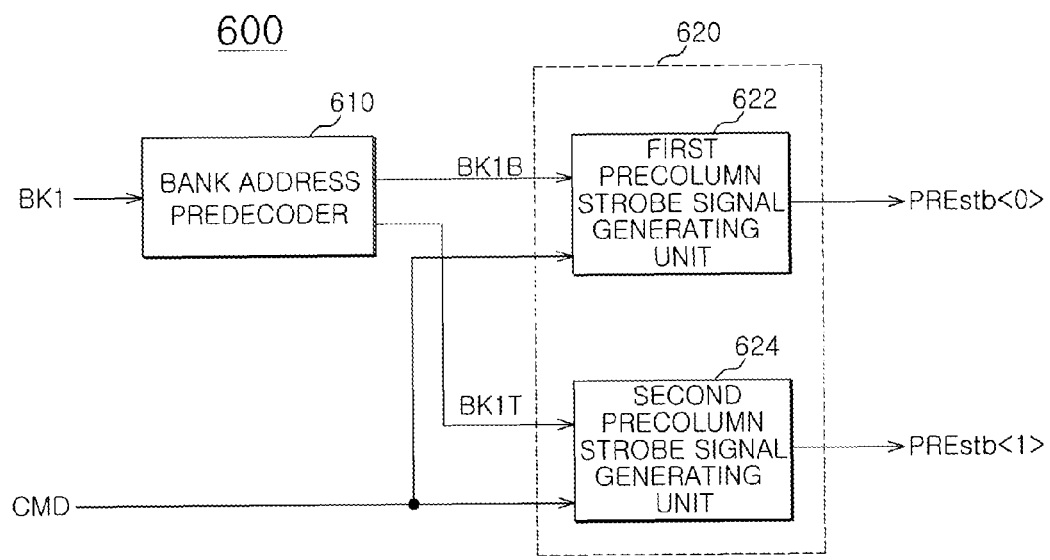
FIG. 2 is a schematic block diagram of an exemplary predecoding block capable of being implemented in the circuit of FIG. 1 according to one embodiment.

FIG. 2 is a schematic block diagram of an exemplary predecoding block 600 capable of being implemented in the device of FIG. 1 according to one embodiment. In FIG. 2, the predecoding block 600 can be configured to include a bank address predecoder 610 and a precolumn strobe signal generating block 620.

The bank address predecoder 610 can receive the second bank address signal 'BK1', and can provide a true signal for a precolumn strobe signal 'BK1T' and a bar signal for a precolumn strobe signal 'BK1B'. In addition, the precolumn strobe signal generating block 620 can include first and second precolumn strobe signal generating units 622 and 624.

In FIG. 2, if the column command signal 'CMD' is activated, then the first and second precolumn strobe signal generating units 622 and 624 can receive a true signal for a precolumn strobe signal 'BK1T' and a bar signal for a precolumn strobe signal 'BK1B', respectively, and can provide the first and second precolumn strobe signals 'PREstb<0:1>'.

Figure 3:
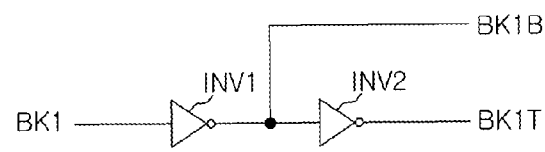
FIG. 3 is a schematic circuit diagram of an exemplary bank address predecoder capable of being implemented in the block of FIG. 2 according to one embodiment.

FIG. 3 is a schematic circuit diagram of an exemplary bank address predecoder 600 capable of being implemented in the block 600 of FIG. 2 according to one embodiment. In FIG. 3, the bank address predecoder 610 can be configured to include first and second inverters IV1 and IV2 that are connected in series. Here, if the second bank address signal 'BK1' is received, then the bank address predecoder 610 may provide a true signal for a precolumn strobe signal 'BK1T' and a bar signal for a precolumn strobe signal 'BK1B' whose levels have been inverted by the first and second inverters INV1 and INV2.

Figure 4:
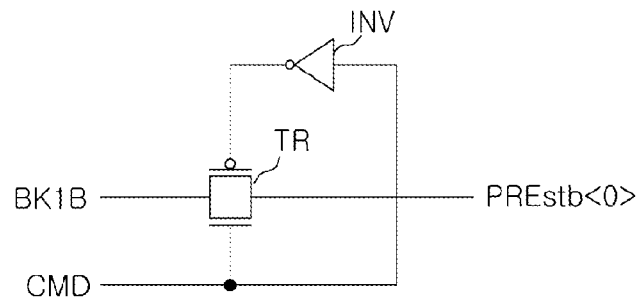
FIG. 4 is a schematic circuit diagram of an exemplary first precolumn strobe signal generating unit capable of being implemented in the block of FIG. 2 according to one embodiment.

FIG. 4 is a schematic circuit diagram of an exemplary first precolumn strobe signal generating unit 622 capable of being implemented in the block 600 of FIG. 2 according to one embodiment. Since the first and second precolumn strobe signal generating units 622 and 624 can be substantially similar to each other in both circuit structure and operational principles, only the first precolumn strobe signal generating unit 622 will be described in detail in order to avoid the repetitive description.

In FIG. 4, the first precolumn strobe signal generating unit 622 can be configured to include a transmitting unit TR and an inverting unit INV. Since the transmitting unit TR can be turned ON in response to the activated column command signal 'CMD', the received bar signal for a precolumn strobe signal 'BK1B' can be provided as the first precolumn strobe signal 'PREstb<0>'.

Figure 5:
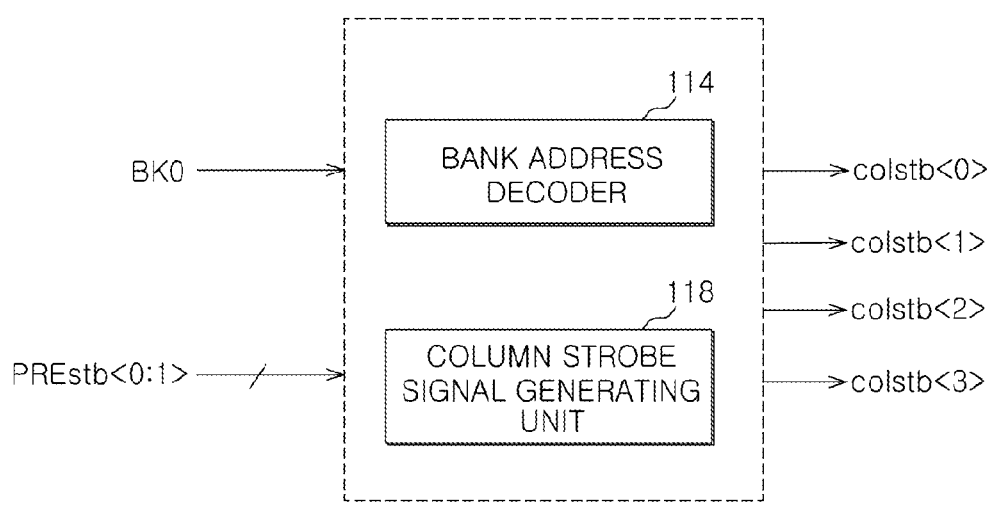
FIG. 5 is a schematic block diagram of an exemplary column signal generating block capable of being implemented in the circuit of FIG. 1 according to one embodiment.
Figure 6:
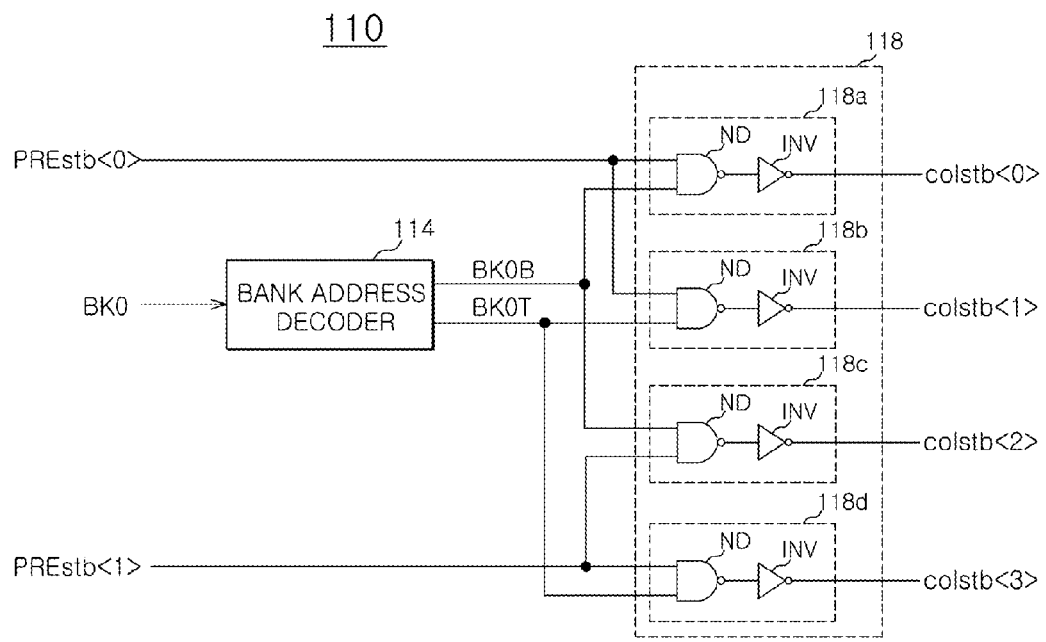
FIG. 6 is a schematic circuit diagram corresponding to the exemplary column signal generating block of FIG. 5 according to one embodiment.

FIG. 5 is a schematic block diagram of an exemplary column signal generating block 110 capable of being implemented in the circuit 1 of FIG. 1 according to one embodiment, and FIG. 6 is a schematic circuit diagram corresponding to the exemplary column signal generating block 110 of FIG. 5 according to one embodiment. In FIGS. 5 and 6, the first column strobe signal generating block 110 can be configured to include a bank address decoder 114 and a column strobe signal generating unit 118.

The first column strobe signal generating block 110 can receive the bank address signal 'BK0', which is not used in generating the precolumn strobe signals, and the first and second precolumn strobe signals 'PREstb<0:1>', and can generate a plurality of column strobe signals 'colstb<0:3>'. For example, the bank address decoder 114 can receive the first bank address signal 'BK0', and can generate a true signal for a column strobe signal 'BK0T' and a bar signal for a column strobe signal 'BK0B'. Since the bank address decoder 114 can have substantially the same circuit structure and operational principles as the bank address predecoder 610 (in FIG. 3), the detailed description of the bank address decoder 114 will be omitted.

In FIGS. 5 and 6, the column strobe signal generating unit 118 can receive the first and second precolumn strobe signals 'PREstb<0:1>' and a true signal for a column strobe signal 'BK0T' and a bar signal for a column strobe signal 'BK0B', and can generate the first to fourth column strobe signals 'colstb<0:3>'. As shown in FIG. 6, the column strobe signal generating unit 118 can include a plurality of decoding units 118a, 118b, 118c, and 118d. Here, each of the decoding units 118a, 118b, 118c, and 118d can include a NAND gate ND and an inverter INV. The column strobe signal generating unit 118 can be a common decoder that decodes a true signal for a column strobe signal 'BK0T' and a bar signal for a column strobe signal 'BK0B' and first and second precolumn strobe signals 'PREstb<0:1>'.

The column strobe signal generating block 110 can use precolumn strobe signals 'PREstb<0:1>' including a portion of bank information that is generated in the peripheral circuit unit B and the remaining bank addresses, which are not used in predecoding. In addition, the column strobe signal generating block 110 can provide a plurality of column strobe signals 'colstb<0:3>' that can select banks included in the individual quarter blocks 100, 200, 300, and 400 (in FIG. 1). For example, if some of the bank addresses are used as predecoding addresses, it is possible to reduce the number of global lines that transmit a signal from the peripheral circuit unit B to the core circuit unit A. Accordingly, if the remaining bank addresses that are not used as the predecoding addresses among the bank addresses and the precolumn strobe signals 'PREstb<0:1>' are decoded again, then it is possible to generate column strobe signals 'colstb<0:3>' that can selectively activate all of the banks.

Since the three global lines are required to correspond to the two precolumn strobe signals 'PREstb<0:1>' transmitted through the global lines and one first bank address signal 'BK0', the number of global lines can be reduced. For example, in response to a column series command, the predecoding block 600 as the first decoding block may use some of the bank addresses for predecoding among an n-number (n is a natural number) of bank addresses to provide a plurality of precolumn strobe signals. Then, in order that the column strobe signal generating block 110 as the second decoding block selectively activates a plurality of banks, the plurality of precolumn strobe signals and the remaining bank addresses that are not related to the first decoding block among the n-number of bank addresses can be decoded, thereby providing $2^n$ column strobe signals.

Figure 7:
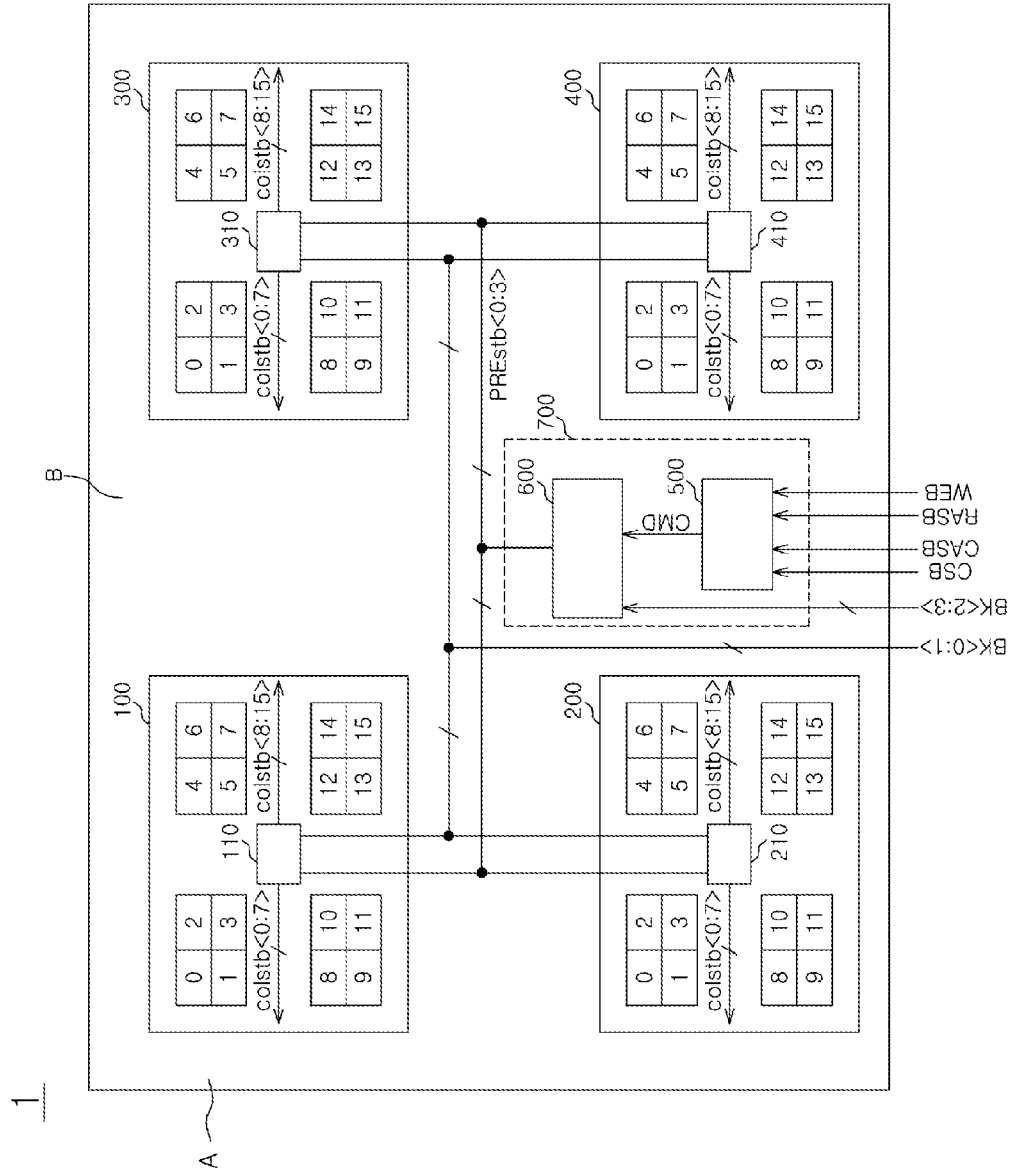
FIG. 7 is a schematic block diagram of another exemplary semiconductor IC according to another embodiment.

FIG. 7 is a schematic block diagram of another exemplary semiconductor IC 1 according to another embodiment. In FIG. 7, the exemplary number of banks is 16. By comparison, the number of banks shown in FIG. 7 is 16 and the number of banks shown in FIG. 1 is 4. In order to avoid the repetitive description, the detailed description of the individual structures shown in FIG. 7 will be omitted. However, numerals that are shown in the quarter blocks 100, 200, 300, and 400 denote the banks, respectively, and 16 banks are included in each of the quarter blocks. Accordingly, 4 bank addresses are needed when 16 banks exist.

In FIG. 7, since a portion of the bank addresses can be related to the predecoding block 600, among the 4 bank addresses, two bank addresses including the third and fourth bank addresses BK2 and BK3 are used, as compared to the structures shown in FIG. 1.

Figure 8:
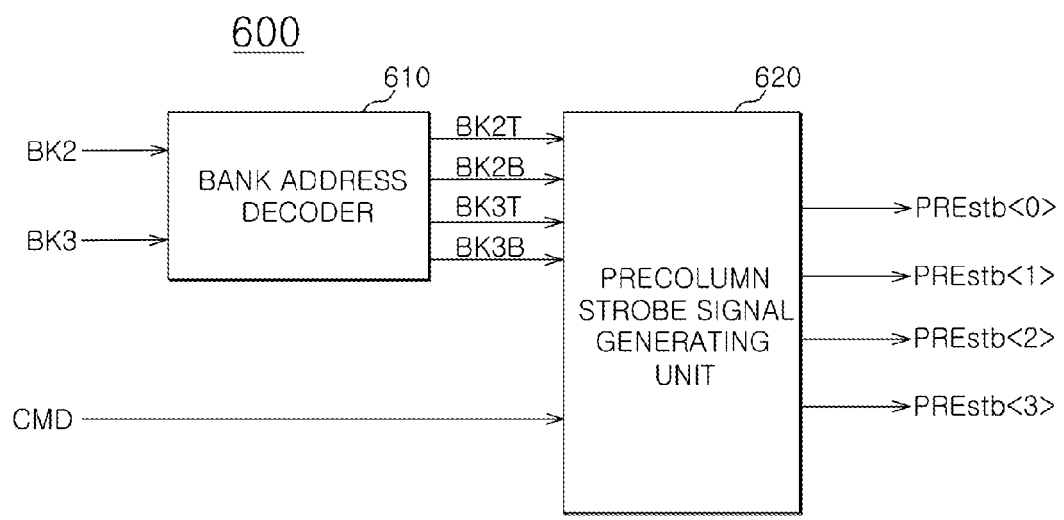
FIG. 8 is a schematic block diagram of an exemplary predecoding block capable of being implemented in the circuit of FIG. 7 according to one embodiment.

FIG. 8 is a schematic block diagram of an exemplary predecoding block 600 capable of being implemented in the circuit 1 of FIG. 7 according to one embodiment. In FIG. 8, the bank address predecoder 610 can receive the third and fourth bank address signals 'BK2' and 'BK3', and can provide four true and bar signals 'BK2T', 'BK2B', 'BK3T', and 'BK3B' for predecoding. In addition, in response to the activated column command signal 'CMD', the precolumn strobe signal generating unit 620 can provide four precolumn strobe signals 'PREstb<0:3>' that correspond to the four true and bar signals 'BK2T', 'BK2B', 'BK3T', and 'BK3B' for predecoding. Accordingly, the number of global lines that transmit a signal from the peripheral circuit unit B to the core circuit unit A may be 6. For example, the four lines for the precolumn strobe signals 'PREstb<0:3>' and the two line for the bank address signals 'BK0' and 'BK1', which are not related to the predecoding block 600, are needed. Thus, area efficiency of the peripheral circuit unit B can be improved by about 65%.

As such, some of the addresses that are used when the banks are selected and the column command signal are predecoded, thereby decreasing the number of global lines that transmit a signal from the peripheral circuit unit to the core circuit unit. Accordingly, it is possible to improve area efficiency of the peripheral circuit unit. Since the number of global lines that cause severe signal distortion is reduced, it is possible to improve signal integrity.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A semiconductor IC, comprising:
   a common column signal generating block configured to receive a command signal and a first bank address signal and to generate a precolumn strobe signal therefrom; and
   a column strobe signal generating block configured to receive the precolumn strobe signal and a second bank address signal and to generate a column strobe signal therefrom.

2. The semiconductor IC of claim 1, further comprising a global line configured to transmit the precolumn strobe signal to the column strobe signal generating block.

3. The semiconductor IC of claim 1, further comprising a peripheral circuit area and a core circuit area, and wherein the common column signal generating block is located at a peripheral circuit unit area and the column strobe signal generating block is located at a core circuit unit area.

4. The semiconductor IC of claim 1, wherein the common column signal generating block includes:
   a command decoder configured to combine the command signal and generate a column command signal therefrom; and a predecoding block configured to decode the first bank address signal and the column command signal.

5. The semiconductor IC of claim 4, wherein the command decoder is configured to provide an activated column command signal when a combination of the external command signal is the column series command signal.

6. The semiconductor IC of claim 4, wherein the predecoding block includes:
a predecoder configured to decode the first bank address signal; and
a precolumn strobe signal generating block configured to receive an output signal of the predecoder and provides the precolumn strobe signal in response to the column command signal.

7. The semiconductor IC of claim 1, wherein the column strobe signal generating block includes:
a bank address decoder configured to decode the second bank address signal; and
a column strobe signal generating unit configured to decode the precolumn strobe signal and an output signal of the bank address decoder, and provide the column strobe signal.

8. A semiconductor IC, comprising:
a precolumn strobe signal generating block configured to receive a command signal and a first bank address signal and to generate one or more precolumn strobe signals therefrom;
a plurality of quarter blocks, each quarter block including a plurality of banks; and
a column strobe signal generating block configured to receive the one or more precolumn strobe signals and a second bank address signal and to generate a plurality of column strobe signals therefrom.

9. The semiconductor IC of claim 8, further comprising a plurality of global lines configured to transmit the precolumn strobe signals to the column strobe signal generating block.

10. The semiconductor IC of claim 8, wherein a total number of the precolumn strobe signals is smaller than a total number of the column strobe signals.

11. The semiconductor IC of claim 8, further comprising a peripheral circuit area and a core circuit area and wherein the common column signal generating block is located at a peripheral circuit unit area and the column strobe signal generating clock is located at a core circuit unit area.

12. The semiconductor IC of claim 8, wherein the precolumn strobe signal generating block provides 2n number of the precolumn strobe signals, when the number of the first bank address is n (n is a natural number).

13. The semiconductor IC of claim 8, wherein the column strobe signal generating block includes:
a bank address decoder configured to decode the second bank address signal; and
a column strobe signal generating unit configured to decode the precolumn strobe signals and an output signal of the bank address decoder, and provide the plurality of column strobe signals.

14. A method for generating a plurality of column strobe signals for use in a semiconductor IC, the method comprising:
receiving a first bank address signal and a command signal;
generating at least one precolumn strobe signal based on the first bank address and the command signal;
receiving a second bank address signal; and
generating a column strobe signal based on the at least one precolumn strobe signal and the second bank address signal.

15. The method of claim 14, further comprising:
receiving a plurality of command signals; and
generating the command signal based on the plurality of command signals.

16. The method of claim 14, further comprising using the column strobe signal to access one or more memory banks in one or more memory blocks.

* * * * *